United States Patent [19]

Wallbillich et al.

[11] Patent Number: 4,883,742

[45] Date of Patent: Nov. 28, 1989

[54] SEAMLESS AND FIRM JOINING OF THE END AND/OR LATERAL AREAS OF PHOTOSENSITIVE LAYERS

[75] Inventors: Günter Wallbillich, Neustadt, Fed. Rep. of Germany; Jan H. Van Heuvelen, Losser, Netherlands

[73] Assignee: BASF Aktiengesellschaft, Ludwigshafen, Fed. Rep. of Germany

[21] Appl. No.: 153,940

[22] Filed: Feb. 9, 1988

[30] Foreign Application Priority Data

Feb. 14, 1987 [DE] Fed. Rep. of Germany ....... 3704693

[51] Int. Cl.$^4$ ................................................. G03C 1/94
[52] U.S. Cl. .................................. 430/275; 430/270; 430/271; 430/273; 430/300; 430/306; 430/307; 430/935; 101/463.1
[58] Field of Search .............. 430/306, 307, 302, 300, 430/327, 270, 271, 273, 275, 330, 935; 101/456, 463.1, 170

[56] References Cited

U.S. PATENT DOCUMENTS

| | | | |
|---|---|---|---|
| 4,337,220 | 6/1982 | Arimatsu | 264/25 |
| 4,601,928 | 7/1986 | Van der Velden | 428/36 |
| 4,758,500 | 7/1988 | Schober et al. | 430/309 |

FOREIGN PATENT DOCUMENTS

| | | |
|---|---|---|
| 0043623 | 1/1982 | European Pat. Off. . |
| 0111371 | 6/1984 | European Pat. Off. . |
| 0040893 | 4/1985 | European Pat. Off. . |
| 2545618 | 4/1977 | Fed. Rep. of Germany . |
| 803918 | 10/1936 | France . |
| 2391072 | 5/1978 | France . |
| 8501052 | 11/1986 | Netherlands . |
| 1579817 | 11/1980 | United Kingdom . |

*Primary Examiner*—Jose G. Dees
*Attorney, Agent, or Firm*—Keil & Weinkauf

[57] ABSTRACT

For the seamless and firm joining of the end and/or lateral areas of thermoplastically processible photosensitive layers, the end and/or lateral areas of one or more solvent-free and unsupported thermoplastically processible photosensitive layers are overlapped avoiding bubbles and with displacement of the air between the end and/or lateral areas, the total layer material is then heated under pressure and with joining of the overlapping end and/or lateral areas, and the resulting continuously joined photosensitive layer is then aftertreated and smoothed with shaping to exact size.

15 Claims, No Drawings

SEAMLESS AND FIRM JOINING OF THE END AND/OR LATERAL AREAS OF PHOTOSENSITIVE LAYERS

The present invention relates to a process for the seamless and firm joining of the end and/or lateral areas of one or more thermoplastically processible photosensitive layers, as used, for example, for the production of printing plates, in particular flexographic printing plates or gravure printing plates, under the influence of heat and pressure with formation of a continuously bonded photosensitive layer having a smooth, uniform surface.

The production of relief and printing plates by means of photosensitive layers is known per se. The photosensitive layers usually employed for this purpose are in general photopolymerizable and/or photocrosslinkable and as a rule contain, in addition to a polymeric binder, one or more photopolymerizable and/or photocrosslinkable compounds, a photoinitiator and further additives and/or assistants, the type and amount of the components depending on the intended use of the photosensitive layers. Because they are simple to process, thermoplastically processible photosensitive layers are frequently used for this purpose. For the production of the relief or printing plates, the photosensitive layers applied to a support or substrate are exposed imagewise to actinic light and then developed in a suitable manner, for example by washing out with a developer. Depending on whether the photosensitive layer is negative-working or positive-working, the unexposed or exposed parts of the layer are removed during development of the relief or printing plates.

For a number of intended uses, in particular in rotary printing, it is necessary to clamp or adhesively bond a photosensitive layer for the production of a printing plate, or the printing layer already prepared from the said layer, to a plate cylinder or a sleeve. After wrapping around the cylinder or the sleeve, the end sections of the layer come up against one another with formation of a gap or a seam. If a plurality of photosensitive layers are arranged one behind the other and/or side by side to cover large plate cylinders or sleeves, the end and/or lateral sections of the said layers come up against one another with formation of seams. A number of difficulties are encountered when working with plate cylinders or sleeves covered in this manner. On the one hand, the seams between the end and/or lateral sections of the individual layers are visible in the printed image, so that rotary printing, i.e. printing a continuous image, is impossible with such a plate. On the other hand, the printing ink which penetrates these seams leads to spraying and may also break the adhesive bond between the printing layer or layers and the plate cylinder or sleeve. In gravure printing, these seams may furthermore considerably interfere with the running of the doctor blade and hence cause damage to the doctor blade and/or the printing layer.

Bonding of the end and/or lateral areas of clamped printing plates with filling of the gap or seams formed in between with a filling compound, as described in, for example, DE-A-25 45 618 or EP-A-118 866 for the production of gravure printing cylinders, may indeed solve some of these problems. However, this method cannot be used directly for the production of gravure printing cylinders or sleeves for continuous printing. Moreover, it is unsuitable for the production of letterpress printing plates.

It has already been suggested, in particular for the production of letterpress printing plates for continuous printing, that a photosensitive polymeric layer be wrapped around a printing cylinder and the abutting end sections seamlessly joined to one another under the influence of heat and pressure. In this context, reference may be made to, for example, DE-A-27 22 896, DE-A28 44 426, DE-A-28 42 440, DE-A-29 11 908, EP-B-40 893, EP-A-43 623 and EP-A-111 371. In these known processes, the photosensitive layers used for the production of the printing plates are trimmed to the circumference of the cylinders or sleeves to be covered, in such a way that, when the photosensitive layer is wrapped around the cylinders or sleeves, the end edges of the said layer come into contact with one another without overlapping or forming a gap. The end areas of the photosensitive layer, which come into contact with one another in this way, are then subjected to a heat treatment under pressure applied to their surface until they are firmly welded to one another. Apart from the requirement that the photosensitive layers must be exactly trimmed to size, these known procedures have further disadvantages, some of them serious. For example, when calender rolls are used for generating the pressure (DE-A-27 22 896 and DE-A28 44 426), the said rolls frequently cause damage to the photosensitive layer. In particular, however, the weld seam formed is relatively weak and not very mechanically stable. A mechanical aftertreatment to shape the photosensitive layers welded by the known methods, for example by turning, cutting, grinding or the like, as required in general for tapering sleeves after covering with a photosensitive layer, is therefore difficult or impossible.

It is an object of the present invention to provide a simple process for the seamless and firm joining of the end and/or lateral areas of thermoplastically processible photosensitive layers for the production of a continuous photosensitive layer having a uniform, smooth surface, which is suitable for the production of printing plates, in particular for gravure printing or flexographic printing. The process should be versatile and widely applicable and ensure substantial freedom with regard to the shape and number of photosensitive layers to be processed. The process should be suitable in particular for the coating of plate cylinders or sleeves, including in the main tapering sleeves, with a seamless, continuous, uniform photosensitive layer for the production of printing plates for rotary printing.

We have found, surprisingly, that this object is achieved by a process in which the end and/or lateral areas of solvent-free and unsupported thermoplastically processible photosensitive layers are united so that they are bubble-free and overlapping and virtually no air cavity is formed in the overlap region, between the end or lateral areas, the total layer material is then heated under pressure, with the result that the overlapping end and/or lateral areas are firmly joined to one another, after which the resulting continuously joined photosensitive layer is aftertreated and smoothed to shape it exactly to size.

The present invention accordingly relates to a process for the seamless and firm joining of the end and/or lateral areas of thermoplastically processible photosensitive layers under the influence of heat and pressure, wherein the end and/or lateral areas of one or more essentially solvent-free and unsupported photosensitive layers are united so that they overlap, avoiding bubbles and with displacement of the air between the end and lateral areas, the total layer material is then heated under pressure and with joining of the overlapping end and/or lateral areas, and the resulting continuously joined photosensitive layer is aftertreated and smoothed with shaping to exact size.

The novel process is simple to carry out and, because of the many possible embodiments, is widely and generally applicable. Surprisingly, the novel process gives mechanically stable, continuous, uniform and homogeneous photosensitive layers which can withstand loads and can be readily processed on an appropriate substrate by imagewise exposure and development to give printing plates or other relief plates of any type. The novel process not only permits the processing of thin photosensitive layers but is also very suitable for joining thick photosensitive layers, for example those having thicknesses up to a few mm.

Any thermoplastically processible, solid photosensitive layers which can be joined to one another under the influence of heat and pressure without their photosensitive properties being adversely affected are suitable for use in the novel process. These include, in particular, the solid, polymeric, photosensitive layers which soften on heating and flow or exhibit adhesive bonding under pressure, as known per se for the production of printing and relief plates. In addition to photodegradable systems, particular examples are the positive-working or negative-working, photosensitive photopolymerizable layers. Suitable photopolymerizable layers contain in general one or more thermoplastically processible polymeric binders, for example soluble nylons, partially hydrolyzed polyvinyl acetates, plasticized polyvinyl alcohols or polyvinyl alcohol derivatives, polyurethanes, diene polymers, such as block copolymers of styrene, butadiene and/or isoprene or butadiene/acrylonitrile copolymers, one or more low molecular weight, ethylenically unsaturated, photopolymerizable compounds, for example the known monomers containing (meth)acrylate or (meth)acrylamido groups, one or more photopolymerization initiators, e.g. benzoin ethers, benzil monoketals or acylphosphine oxides, and conventional additives and/or assistants, for example thermal polymerization inhibitors, dyes, pigments, fillers, plasticizers, leveling agents, sensitometric regulators, etc. Particularly suitable photosensitive photopolymerizable layers for the novel process are those known and described for the production of flexographic printing plates or gravure printing plates (cf. for example DE-A-22 15 090, DE-A-29 02 412, EP-B-27 612, DE-A-20 61 287, EP-A-70 510 and EP-A-70 511). The thickness of the photosensitive layers to be used is not critical for the novel process and can, as stated, be varied within wide limits. The layer thickness is usually from about 100 to about 1500 μm.

The thermoplastically processible photosensitive layers to be used in the novel process should be solvent-free and without a support. For the purposes of the present invention, solvent-free means that the photosensitive layers to be used should not contain a substantial amount of a solvent, for example from their preparation. However, the photosensitive layers to be used can contain a small residual amount of solvent, for example less than 5, in particular less than 2, % by weight, based on the photosensitive layer. What is important is that the solvent content of the photosensitive layers to be used according to the invention is so low that the layers do not form gas under the processing conditions in the novel process. Advantageously, therefore, the photosensitive layers used as starting materials for the novel process are those which have been prepared in the absence of a solvent by kneading, extruding, calendering, pressing, etc.

Of course, the photosensitive layers to be used according to the invention are unsupported in order to permit firm fusing together or bonding of the overlapping end and/or lateral areas of the photosensitive layers in the novel process with formation of a continuous homogeneous layer. Hence, it is preferably, but not essential, to use self-supporting photosensitive layers in the novel process. It is also possible for the photosensitive layers used first to be applied to a temporary support, for example a plastic film, which is then removed directly before the photosensitive layers are used in the novel process, for example by peeling it off.

The unsupported photosensitive layers to be used in the novel process may have any shape provided that they can be overlapped in their edge areas to be joined. Hence, the photosensitive layers to be joined need not be cut exactly to size. The said layers may be, for example, square, rectangular, trapezoidal, in the form of a parallelogram, etc., and are as a rule sheet-like, belt-like or strip-like. Furthermore, the end and/or lateral areas of the photosensitive layers, which areas are to be joined, may in principle possess any form of edges and edge structures. For example, the edges may be nonlinear, but as a rule are linear. The edges of the said end and/or lateral areas may be at right angles to the layer surface. However, they may also be beveled or chamfered and, for example, wedge-shaped. The last-mentioned embodiment, in which photosensitive layers are used whose end and/or lateral areas to be joined have wedge-shaped edges, has proven equally advantageous when both thin and thick photosensitive layers are used. At the point to be joined, one or both edges of the overlapping end or lateral areas of the photosensitive layer or layers can be wedge-shaped, and it has proven particularly advantageous if in each case at least the lower edge in the overlapping end or lateral areas is appropriately beveled. In another, particularly advantageous version of this embodiment, the photosensitive layer or layers is or are arranged, when the end and/or lateral areas to be joined are overlapped, in such a way that, in that edge of the relevant end or lateral area which lies underneath in the overlapping region, the wedge-shaped bevel is directed downward and away from the layer on top. Of course, a very wide range of combinations of layer shape, edge form and bevel is possible among the versions described above.

Since the novel process for firmly joining the end and/or lateral areas of photosensitive layers is carried out under pressure, the photosensitive layers are most advantageously first applied to a firm, in particular dimensionally stable, substrate in order to join their end and/or lateral areas. The surface of this substrate may be flat or curved, smooth or rough or structured, in order, for example, to achieve better adhesion between the photosensitive layer and the substrate. Substrates which are preferably used from the outset are materials which are intended to be covered with the photosensitive layers and, after firm joining of the end and/or lateral areas of the photosensitive layers, simultaneously serve as a support for the resulting continuously joined photosensitive layer.

Depending on the type and shape of the substrate, the photosensitive layers are either simply placed on the said substrate or are preferably fixed thereon in a suitable manner, in order to join the end and/or lateral areas of the said layers. Fixing can be effected, for example, purely mechanically or, advantageously, by means of a mixture of adhesive-forming components, a double-sided self-adhesive tape, a hot-melt adhesive or the like. Although the shape of the substrate is not in general critical, sheets, cylinders or cylindrical or conical pipes or sleeves are particularly used for this purpose. In particular, the novel process has proven very suitable for coating plate cylinders and sleeves, in particular conical sleeves, as used, inter alia, in rotary printing, with a continuous seamless photosensitive layer.

Suitable materials for the substrate include metals, plastics, glass fiber-reinforced plastics and the like, as well as coated materials, for example metallic cylinders or metallic sleeves having a plastic or rubber layer or a covering of a knitted textile fabric. Other suitable substrates are elements having a solid, photosensitive, in particular photopolymerizable, layer applied to a dimensionally stable support, for example of metal or plastics, which makes it possible, for example, for plate cylinders or sleeves as used for rotary printing, including those having a plurality of strata of photosensitive layers of the same type or different types, to be covered continuously and seamlessly by the novel process.

According to the invention, the end areas of only one photosensitive layer can be joined to one another by wrapping the said layer around a cylinder, a cylindrical or conical sleeve or the like in such a way that its end areas overlap. It is also possible for the lateral areas of only one photosensitive layer to be firmly and seamlessly joined to one another if the web-like or belt-like photosensitive layer is wound spirally around a cylinder, a cylindrical or conical sleeve or the like in such a way that its lateral areas overlap. It is also possible, according to the invention, for the end and/or lateral areas of two or more photosensitive layers mounted one behind the other and/or side by side on a substrate to be joined to one another. If there are two or more overlaps of the end and/or lateral areas, these overlaps can be arranged in the form of roof tiles or staggered layer by layer. In the last-mentioned case, for example, two adjacent end or lateral areas of photosensitive layers are covered by a further photosensitive layer, for example one in the form of a strip. The extent to which the end and/or lateral areas of the photosensitive layers are overlapped according to the invention for firm joining should be at least sufficient to give a firm, mechanically processible join after the heat and pressure treatment, but is otherwise not critical. In general, the overlap area at a join is not more than 50%, in particular not more than 25%, of the area of the layer. We have found that, for practical applications, overlaps about 1–10 cm wide are useful and advantageous.

To carry out the novel process, the end and/or lateral areas of the photosensitive layers to be joined are united in the overlap area without bubbles and with displacement of the air under the end or lateral area which forms the upper stratum in this case. This means that not only must the immediate overlap area in which the said end or lateral areas are placed directly one on top of the other be free of bubbles and enclosed air, but also in the adjacent area where the end or lateral areas to be joined come into contact with one another, under the photosensitive layer which is the uppermost one on overlapping, the air is displaced and virtually no air cavity is formed underneath. This can be effected, for example, by appropriately pressing the photosensitive layer forming the upper stratum in the overlap area, for example by means of a roll, to displace air. To ensure and maintain a close fit of the layer forming the upper stratum of the overlap against the edge of the layer forming the lower stratum of the overlap at the line where the end and lateral areas to be joined meet, while avoiding the formation of an air cavity in this area, it may be advisable and useful to press the layer in the abovementioned manner during overlapping in the presence of a conventional laminating assistant and/or, in particular, under the influence of heat.

For firm joining of the end and/or lateral areas of photosensitive layers, which areas have been overlapped on a substrate in this manner without bubbles, the total photo-sensitive layer material is then, according to the invention, heated under pressure until the overlapped end and/or lateral areas are firmly joined to one another and a cohesive, continuous photosensitive layer has formed. The temperatures to be used here depend primarily on the thermal and rheological properties of the photosensitive layers used and are at least sufficiently high for the overlapped end and/or lateral areas to be bonded to one another or caused to flow into one another under the applied pressure, but not so high as to adversely affect the properties of the photosensitive layers. Otherwise, the temperatures are chosen so that joining of the end and/or lateral areas takes place in an appropriate time. Usually, temperatures of about 40°–200° C., in particular about 80°–150° C., are used. The layer material can be heated from the back, i.e. from that side of the layer which rests on the substrate, for example by means of heating elements arranged in the substrate. Particularly suitable heating elements of this type are electrical resistance heaters. However, it is also possible to heat the layer material from the outer layer surface, for example by means of infrared or microwave radiation, hot air blowers or the like. Of course, both methods of heating, from the back and from the outer layer surface, may be carried out simultaneously.

The pressure acting on the layer surface during heating of the photosensitive layers can in principle be generated in any suitable manner. For example, a firm thrust element whose shape is adapted to the shape of the surface of the substrate, for example a stamp or the like, can be used for this purpose. If the photosensitive layers are applied to a plate cylinder or a sleeve, including conical sleeves, for joining their end and/or lateral areas, the application of reduced pressure between the plate cylinder or sleeve on the one hand and the photosensitive recording layer or layers on the other hand, with removal of air and any other gases present by suction, has proven particularly simple and advantageous for pressure generation. This can be carried out in a conventional manner, for example by covering the photosensitive layers, which are overlapped on the plate cylinder or sleeve, with a gas-tight plastic film or shrink film and evacuating, the substrate being provided with appropriate extraction orifices or surface channels permitting extraction of gases between the photosensitive layer and the substrate, or the like. In this context, reference may be made to the prior art cited above. In a possible, advantageous embodiment of the novel process, the plate cylinder or sleeve, which may be provided with an adhesion-promoting layer, is covered with a knitted textile fabric for this purpose before the photosensitive layers are overlapped on top of this in their end and/or lateral areas, a gas-tight covering comprising a plastic film is provided and reduced pressure is then applied.

The time for which the photosensitive layers overlapped in their end and/or lateral areas are subjected to the heat and pressure treatment to join them firmly essentially depends on the type of photosensitive layers and the process conditions and is usually from about 10 to 120 minutes.

Heating under pressure results in firm joining of the overlapped end and/or lateral areas of the photosensitive layers. After cooling, the resulting continuously joined photosensitive layer is subjected to a shaping, in particular mechanical, aftertreatment to obtain the exact dimensions. For this shaping aftertreatment, the continuous photosensitive layers joined in their end and/or lateral areas generally and advantageously remain on the firm substrate to which they were applied for firm joining of the said areas.

The shaping aftertreatment serves in particular to produce a dimensionally exact, continuous, uniform seamless photosensitive layer and not only equalizes fluctuations in the layer surface but is, for example, particularly important for obtaining an exact cylindrical periphery when the photosensitive layers to be joined are mounted on plate cylinders or sleeves, including conical sleeves, and, after production of the continuously joined photosensitive layer, are intended for use for the production of printing cylinders or sleeves. Particularly where conical sleeves are used as substrates, it is in fact necessary to equalize the longitudinal axial decrease or increase in the diameter of the sleeve by the shaping aftertreatment. The said aftertreatment can in principle be carried out by any suitable method and is preferably effected by mechanical working of the surface of the photosensitive layer, for example turning, cutting, grinding or the like. Smoothing of the surface of the continuously joined uniform photosensitive layer aftertreated in this manner can be effected by conventional procedures, for example by solvent treatment, smoothing rolls or the like. The shaping aftertreatment and smoothing may also include a suitable thermal treatment, for example hot calendering.

The continuous, seamless, uniform photosensitive layers prepared according to the invention have a very wide variety of applications, for example as coatings, for the production of resist images or decorative relief surfaces. In particular, however, they can be used for the production of printing plates, in particular for flexographic printing plates or gravure printing plates, by the conventional methods of imagewise exposure to actinic light and development. The continuous photosensitive layers joined by the novel process can be covered with protective films, surface coatings, matt films or the like before further processing and use.

In particular, the novel process is suitable for the production of cylinders or sleeves covered with continuous, seamless photosensitive layers, as used for the production of printing plates and printing cylinders for rotary printing, in particular in continuous printing.

The Examples which follow illustrate the invention.

EXAMPLE 1

An unsupported, rectangular, photosensitive, photopolymerizable layer 0.5 mm thick, prepared from the components described in Comparative Experiment A of EP-A70 510, for the production of photopolymer gravure printing plates was wrapped around a cylindrical nickel sleeve, provided with an adhesion-promoting layer, in such a way that the two layer edges parallel to the axis overlapped one another by about 2 cm. After covering with a gas-tight film and generating reduced pressure between the photosensitive layer and the surface of the nickel sleeve, the total photosensitive layer was heated at 130° C. for about 30 minutes. Thereafter, the photosensitive layer was firmly bonded to the nickel sleeve and furthermore the overlapped end areas of the photosensitive layer were completely and firmly joined to one another with fusion. After the layer had been cooled and the gas-tight film removed, the surface of the photosensitive layer joined in its end areas was brought to the desired cylindrical dimension by turning using a tungsten carbide tool. Finally, the layer surface was smoothed by polishing and hot calendering. A sleeve having a continuous seamless, smooth and uniform photosensitive layer resulted. In the process of Example 1 of EP-A-70 510, it was possible to produce therefrom a satisfactory printing plate for rotary gravure printing by imagewise exposure to actinic light and development with a developer.

EXAMPLE 2

The procedure described in Example 1 was followed, except that in this case a 0.8 mm thick, rectangular, photopolymerizable layer of otherwise identical composition was wrapped around a slightly conical nickel sleeve. The two end sections of the photopolymerizable layer, which were parallel to the axis and overlapped by about 3 cm, were wedge-shaped in the overlap area. To facilitate extraction of gases for generating reduced pressure, the conical nickel sleeve was in this case covered with a fine-denier stocking of manmade fiber before being wrapped in the photopolymerizable layer. After the end areas of the said layer had been joined and the layer surface turned and smoothed as in Example 1, an exactly cylindrical sleeve provided with a seamless photosensitive layer was obtained, from which a gravure printing plate for continuous printing could be produced by exposure to actinic light and development with a developer.

EXAMPLE 3

A 0.7 mm thick, rectangular, photopolymerizable layer based on an alcohol-soluble nylon as described in Example 1 of EP-A-46 047 was applied to a sleeve in the manner described in Example 2, the sleeve in this case consisting of a phenol resin. After the end areas of the photosensitive layer had been joined and the layer surface polished and smoothed as in Example 2, an exactly cylindrical sleeve was obtained. Its seamless, smooth, photopolymerizable layer was exposed imagewise to actinic light and then developed. The resulting printing plate gave excellent results in rotary letterpress printing.

EXAMPLE 4

A 0.5 mm thick photopolymerizable layer which was suitable for the production of letterpress printing plates and was prepared according to Example 4 of EP-A-10 690, was applied to a cylindrical sleeve of glass fiber-reinforced polyester and further processed, these steps being carried out as described in Example 1. The resulting, exactly cylindrical sleeve having a smooth, seamless surface of the photopolymerizable layer was exposed imagewise to actinic light in a conventional manner and developed to give a printing plate having excellent properties.

EXAMPLE 5

A 1.2 mm thick, photopolymerizable layer cut to rectangular shape, according to Example 1 of DE-A-29 42 183, was applied to a conical nickel sleeve provided with a mixture of adhesion-promoting components, in such a way that the wedge-shaped end areas overlapped by about 2 cm. The layer ends in the overlap area were fused with one another by heating under pressure. Thereafter, an exactly cylindrical smooth surface was produced by polishing and calendering. The resulting sleeve was suitable for the production of flexographic printing plates.

We claim:

1. A process for the coating of a cylinder or sleeve with a seamless photosensitive layer, said process comprising:
    applying to the cylinder or sleeve one or more unsupported photosensitive layers to cover the surface of the cylinder or sleeve therewith, said photosensitive layer or layers being essentially solvent-free and thermoplastically processable;
    carrying out the said application of the photosensitive layer or layers to the cylinder or sleeve in such a way that the end and/or lateral areas of the photosensitive layer or layers that are next to each other overlap;
    displacing the air between the overlapping end and/or lateral areas to prevent any bubble formation therebetween;
    heating the total layer material under pressure, thereby joining the overlapping end and/or lateral areas, and
    shaping to the exact size and smoothing the resulting continuously joined photosensitive layer.

2. The process of claim 1, wherein a least the end and/or lateral areas forming the lower stratum in the overlap area is wedge-shaped.

3. The process as claimed in claim 2, wherein the wedge-shaped bevel is directed downward and away from the layer on top.

4. The process of claim 1, wherein the solvent-free, thermoplastically processible photosensitive layers used are those which do not form gas under the processing conditions.

5. The process of claim 1, wherein the photosensitive layer forming the upper stratus in the overlapping area is united with the end and/or lateral area of the photosensitive layer forming the lower stratum in the overlap area, with displacement of air by pressing.

6. The process of claim 1, wherein overlapping of the end and/or lateral areas of the photosensitive layers is carried out under the influence of heat or in the presence of a laminating assistant or under the influence of heat and with the concomitant use of a laminating assistant.

7. The process of claim 1, wherein the end and/or lateral areas to be joined overlap by about 1–10 cm.

8. The process of claim 1, wherein the layer material is heated to about 80°–150° C. for joining the overlapping end and/or lateral areas.

9. The process of claim 1, wherein the pressure is about 0.1–1 kg/cm$^2$.

10. The process of claim 1, wherein the photosensitive layers are applied to a dimensionally stable substrate before their end and/or lateral areas are joined.

11. The process of claim 10, wherein the substrate is a cylinder, a cylindrical sleeve or a conical sleeve of metal, plastic or glass fiber-reinforced plastic.

12. The process of claim 10, wherein heating for joining the overlapping end and/or lateral areas of the photosensitive layers is carried out under reduced pressure between the substrate and the photosensitive layer or under a plastic film or shrink file covering the said layers.

13. The process of claim 1, wherein a weblike photosensitive layer is used, the said layer being wound around a plate cylinder or a sleeve in such a way that the end sections of the web-like photosensitive layer overlap.

14. The process of claim 1, wherein the shaping aftertreatment to give exact dimensions is carried out mechanically by turning, cutting or grinding.

15. The process of claim 1, wherein a continuous, seamless, uniform photosensitive layer having an exact cylindrical outer surface is formed on a plate cylinder or a sleeve.

* * * * *